United States Patent
Chun (10) Patent No.: US 7,791,959 B2
(45) Date of Patent: Sep. 7, 2010

(54) MEMORY INTEGRATED CIRCUIT DEVICE PROVIDING IMPROVED OPERATION SPEED AT LOWER TEMPERATURE

(75) Inventor: Ki-Chul Chun, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 775 days.

(21) Appl. No.: 11/708,321

(22) Filed: Feb. 21, 2007

(65) Prior Publication Data

US 2007/0194381 A1 Aug. 23, 2007

(30) Foreign Application Priority Data

Feb. 21, 2006 (KR) .................... 10-2006-0016685

(51) Int. Cl.
*G11C 5/14* (2006.01)
(52) U.S. Cl. ............. 365/189.09; 327/534; 365/185.27; 365/226
(58) Field of Classification Search ................. 327/530, 327/534; 365/189.09, 226, 185.27
See application file for complete search history.

(56) References Cited

U.S. PATENT DOCUMENTS

| | | | |
|---|---|---|---|
| 5,225,716 A | 7/1993 | Endo et al. | |
| 6,147,508 A | 11/2000 | Beck et al. | |
| 6,556,068 B2 * | 4/2003 | Forbes et al. | 327/537 |
| 6,744,305 B2 * | 6/2004 | Oikawa et al. | 327/541 |
| 7,002,869 B2 * | 2/2006 | Zhang et al. | 365/226 |
| 7,049,880 B2 * | 5/2006 | Sivero et al. | 327/536 |
| 7,138,851 B2 * | 11/2006 | Sumita et al. | 327/534 |
| 7,439,591 B2 * | 10/2008 | Kang | 257/360 |
| 2003/0021161 A1 | 1/2003 | Fifield et al. | |
| 2008/0175068 A1 * | 7/2008 | Houston et al. | 365/185.27 |

FOREIGN PATENT DOCUMENTS

| | | |
|---|---|---|
| JP | 04-126410 | 4/1992 |
| KR | 10-2005-0041595 | 5/2005 |

* cited by examiner

*Primary Examiner*—Dang T Nguyen
*Assistant Examiner*—Alexander Sofocleous
(74) *Attorney, Agent, or Firm*—Harness, Dickey & Pierce, P.L.C.

(57) ABSTRACT

A memory integrated circuit device may include a first temperature sensing unit, a first voltage adjusting unit, and a MOS back bias voltage outputting unit. The first voltage adjusting unit may be configured to output a voltage based on an output signal of the temperature sensing unit such that the voltage output changes based on changes in a sensed temperature. The MOS back bias voltage outputting unit may be configured to receive the voltage output by the voltage adjusting unit and configured to output the MOS back bias voltage based on the voltage output by the first voltage adjusting unit.

31 Claims, 7 Drawing Sheets

FIG. 11

MEMORY INTEGRATED CIRCUIT DEVICE PROVIDING IMPROVED OPERATION SPEED AT LOWER TEMPERATURE

PRIORITY STATEMENT

This application claims the benefit of priority to Korean Patent Application No. 10-2006-0016685, filed on Feb. 21, 2006, in the Korean Intellectual Property Office, the entire contents of which are incorporated herein in their entirety by reference.

BACKGROUND

1. Field

Example Embodiments relate to a memory integrated circuit device, and for example, to a memory integrated circuit device that includes MOS transistors whose operation speeds may be improved due to the decreasing of their threshold voltages at lower temperatures.

2. Description of Related Art

With the development of semiconductor manufacturing technology, the memory density of memory integrated circuit devices has rapidly increased of late. The increase of memory density may cause power consumption of memory integrated circuit devices to increase. One method of reducing the power consumption of memory integrated circuit devices is to lower power supply voltages used in the memory integrated circuit devices.

A memory integrated circuit device may include a plurality of MOS transistors. The threshold voltage VT of each of the MOS transistors and the power supply voltage VDD of the memory integrated circuit device may have the relationship expressed in Formula 1:

$$VDD \geq (3 \times VT) \tag{1}$$

Figure 1:
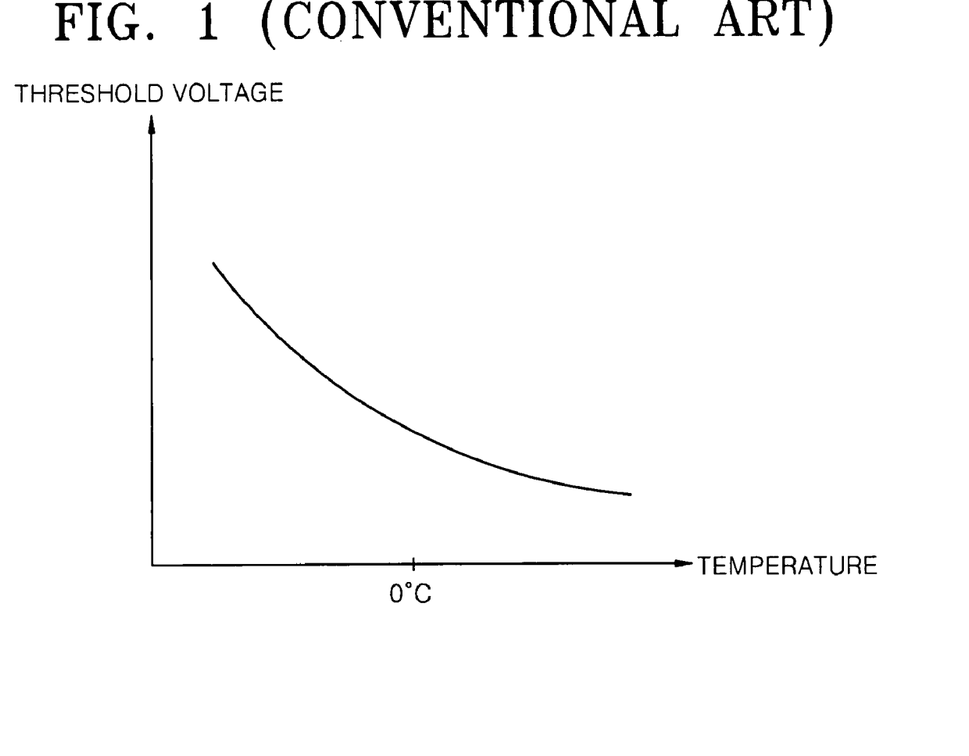
FIG. 1 is an example graph of a threshold voltage of a MOS transistor with respect to temperature.

FIG. 1 is an example graph of a threshold voltage of a MOS transistor with respect to the temperature of the memory integrated circuit device. Referring to FIG. 1, if the power supply voltage VDD is lower, the threshold voltage of the MOS transistor may increase as the temperature decreases.

A conventional method to lower the threshold voltage of a NMOS transistor provides a temperature independent constant current source that provides a constant current through a diode thereby producing a voltage drop across a diode. The voltage drop of the diode is temperature dependent, for example the voltage drop of the diode decreases as a temperature of the diode increases. The voltage drop across the diode is applied to a first input of a summing circuit and a constant reference voltage output from a temperature independent constant voltage source is applied to a second input of the algebraic summing circuit. The logic circuit is designed to operate at a predetermined temperature, and the magnitude of the reference voltage may be chosen to equal the magnitude of the voltage drop of the diode when the diode is at the predetermined temperature. Accordingly, an output of the summing circuit is output as a NMOS back bias voltage based on the temperature of the diode.

A conventional method to lower the threshold voltage of a PMOS transistor provides a temperature independent constant current source that provides a constant current to a resistor. The temperature coefficient of the resistor is positive, and the resistor's resistance increases with increasing temperature. The current flowing through the resistor produces a voltage drop which is supplied to a first input of a summing circuit. A second input of the summing circuit is coupled to ground. The constant current source and resistor are predetermined such that, at equilibrium, the voltage drop of the resistor is substantially equal to a supply voltage of the logic circuit when the logic circuit is operating at its nominal temperature. Accordingly, an output of the summing circuit is output as PMOS back bias based on the temperature of the resistor.

However, these conventional methods use means for increasing or decreasing the back bias voltage of a MOS transistor at a specific normal temperature, for example, 85° C., as its starting point but do not disclose means for improving the characteristics of the back bias voltage of the MOS transistor at a lower temperature (e.g., a sub-zero temperature). Moreover, the conventional art does not disclose means for changing the back bias voltage of the MOS transistor at all temperatures in a range of a higher temperature to a lower temperature.

Memory integrated circuit devices may not only be used at a normal temperature but may also be occasionally used at a higher temperature and a lower temperature. In a conventional memory integrated circuit device, the threshold voltage of a MOS transistor that uses a lower power supply voltage VDD sharply increases at a lower temperature, so that the operating speed of the conventional memory integrated circuit device may be decreased. In addition, the threshold voltage of the MOS transistor may be lower at a higher temperature, so that leakage current may increase compared with that at a normal temperature.

SUMMARY

Example embodiments may provide a memory integrated circuit device that may use a lower power supply voltage and may operate at an improved speed at a lower temperature.

Example embodiments may also provide a memory integrated circuit device that may use a lower power supply voltage and may reduce an increase in leakage current at a higher temperature.

According to an example embodiment, a memory integrated circuit device may include a MOS back bias voltage generator configured to generate a MOS back bias voltage. The MOS back bias voltage generator may include a temperature sensing unit, a first voltage adjusting unit, and a MOS back bias voltage outputting unit. The temperature sensing unit may be configured to sense a temperature of the memory integrated circuit device. The first voltage adjusting unit may be configured to receive an output signal of the temperature sensing unit and configured to output a voltage based on the output signal of the temperature sensing unit such that the voltage output changes based on changes in the sensed temperature. The MOS back bias voltage outputting unit may be configured to receive the voltage output by the voltage adjusting unit and configured to output the MOS back bias voltage based on the voltage output by the voltage adjusting unit.

According to an example embodiment, the MOS back bias voltage generator may be a PMOS back bias voltage generator, the MOS back bias voltage may be a PMOS back bias voltage, the MOS back bias voltage outputting unit may be a PMOS back bias voltage outputting unit. The first voltage adjusting unit may be configured to adjust the voltage output such that the PMOS back bias voltage outputting unit increases the PMOS back bias voltage if the sensed temperature increases, and decreases the PMOS back bias voltage if the sensed temperature decreases.

According to an example embodiment, the MOS back bias voltage generator may be a NMOS back bias voltage generator, the MOS back bias voltage may be a NMOS back bias voltage, the MOS back bias voltage outputting unit may be a NMOS back bias voltage outputting unit. The first voltage adjusting unit may be configured to adjust the voltage output such that the NMOS back bias voltage outputting unit decreases the NMOS back bias voltage if the sensed temperature increases, and increases the NMOS back bias voltage if the sensed temperature decreases.

According to an example embodiment, the memory integrated circuit device may further include a plurality of MOS transistors, and the MOS back bias voltage generator may be configured apply the MOS back bias voltage to the plurality of MOS transistors.

According to an example embodiment, a memory integrated circuit device may include a PMOS back bias voltage generator which may generate a PMOS back bias voltage. The PMOS back bias voltage generator may include a first temperature sensing unit sensing the temperature of the memory integrated circuit device; a first voltage adjusting unit receiving an output signal of the first temperature sensing unit and outputting a voltage in response to the output signal of the first temperature sensing unit; and a PMOS back bias voltage outputting unit receiving the voltage output by the first voltage adjusting unit, outputting the PMOS back bias voltage, increasing the PMOS back bias voltage if the temperature of the memory integrated circuit device increases, and decreasing the PMOS back bias voltage if the temperature of the memory integrated circuit device decreases.

According to an example embodiment, the memory integrated circuit device may further include a plurality of PMOS transistors, and the PMOS back bias voltage generator which may generate the PMOS back bias voltage may apply the PMOS back bias voltage to the PMOS transistors.

According to an example embodiment, the first temperature sensing unit may be configured to receive a refresh signal for refreshing a plurality of memory cells that may be included in the memory integrated circuit device, and may be configured to be activated if the refresh signal is active to sense the temperature of the memory integrated circuit device.

According to an example embodiment, the output signal of the first temperature sensing unit may include a plurality of digital bits.

According to an example embodiment, the first temperature sensing unit may configured to output each of the plurality of digital bits to be all "1" if the temperature of the memory integrated circuit device may be an upper level, and may be configured to output each of the plurality of digital bits to be all "0" if the temperature of the memory integrated circuit device may be a lower level.

According to an example embodiment, the first voltage adjusting unit may include a first resistor configured to receive the PMOS back bias voltage; an n-th resistor configured to receive the ground voltage of the memory integrated circuit device; second through (n−1)th resistors connected between the first resistor and the n-th resistor; and a plurality of MOS transistors connected to the second through (n−1)th resistors, respectively, in parallel, and the plurality of MOS transistors may be configured to receive respective portions of the output signal of the first temperature sensing unit through their gates, and the output voltage of the first voltage adjusting unit may be output through a connection node between the first and second resistors.

According to an example embodiment, the plurality of MOS transistors may be a plurality of NMOS transistor.

According to an example embodiment, the PMOS back bias voltage outputting unit may include a differential amplifier configured to receive a first external reference voltage and the output voltage of the first voltage adjusting unit; and an output driver configured to receive a voltage output by the differential amplifier, configured to output the PMOS back bias voltage, and configured to increase the PMOS back bias voltage if the output voltage of the differential amplifier is active, and configured to decrease the PMOS back bias voltage if the output voltage of the differential amplifier is inactive.

According to an example embodiment, the differential amplifier may include an inverting port and a non-inverting port and may be configured to receive the first external reference voltage through the inverting port and the output voltage of the first voltage adjusting unit through the non-inverting port.

According to an example embodiment, the output driver may include a PMOS transistor configured to receive the output voltage of the differential amplifier through its gate and a power supply voltage through its source and configured to output the PMOS back bias voltage through its drain.

According to an example embodiment, the power supply voltage applied to the output driver may be higher than the upper value of the PMOS back bias voltage.

According to an example embodiment, the power supply voltage applied to the output driver may be one of an external voltage input to the memory integrated circuit device, a wordline boosting voltage for boosting the voltages of wordlines included in the memory integrated circuit device, and a bitline precharge voltage for precharging bitlines included in the memory integrated circuit device.

According to an example embodiment, the PMOS back bias voltage may be higher than a power supply voltage of the memory integrated circuit device.

According to another example embodiment, a memory integrated circuit device may include an NMOS back bias voltage generator which generates an NMOS back bias voltage The NMOS back bias voltage generator may include a second temperature sensing unit sensing the temperature of the memory integrated circuit device; a second voltage adjusting unit receiving an output signal of the second temperature sensing unit and outputting a voltage in response to the output signal of the second temperature sensing unit; and an NMOS back bias voltage outputting unit receiving the voltage output by the second voltage adjusting unit, outputting the NMOS back bias voltage, decreasing the NMOS back bias voltage if the temperature of the memory integrated circuit device increases, and increasing the NMOS back bias voltage if the temperature of the memory integrated circuit device decreases.

According to an example embodiment, the memory integrated circuit device may further include a plurality of NMOS transistors, and the NMOS back bias voltage generator which may generate the NMOS back bias voltage may apply the NMOS back bias voltage to the NMOS transistors.

According to an example embodiment, the second temperature sensing unit may be configured to receive a refresh signal for refreshing a plurality of memory cells that may be included in the memory integrated circuit device, and may be configured to be activated if the refresh signal is active to sense the temperature of the memory integrated circuit device.

According to an example embodiment, the output signal of the second temperature sensing unit may include a plurality of digital bits.

According to an example embodiment, the second temperature sensing unit may be configured to output each of the plurality of digital bits to be all "1" if the temperature of the memory integrated circuit device may be an upper level, and may be configured to output each of the plurality of digital bits to be all "0" if the temperature of the memory integrated circuit device may be a lower level.

According to an example embodiment, the second voltage adjusting unit may include a first resistor configured to receive a power supply voltage of the memory integrated circuit device; an n-th resistor configured to receive the NMOS back bias voltage; second through (n−1)th resistors connected between the first resistor and the n-th resistor; and a plurality of MOS transistors connected to the second through (n−1)th resistors, respectively, in parallel, wherein the plurality of MOS transistors may be configured to receive the output signal of the second temperature sensing unit through their gates, and the output voltage of the second voltage adjusting unit may be output through a connection node between the n-th and (n−1)th resistors.

According to an example embodiment, the plurality of MOS transistors may be a plurality of NMOS transistors.

According to an example embodiment, the NMOS back bias voltage outputting unit may include a differential amplifier configured to receive receiving a second external reference voltage and the output voltage of the second voltage adjusting unit; and an NMOS back bias voltage oscillation and pumping unit configured to receive a voltage output by the differential amplifier, configured to output the NMOS back bias voltage, and configured to decrease the NMOS back bias voltage if the output voltage of the differential amplifier may be active, and configured to increase the NMOS back bias voltage if the output voltage of the differential amplifier may be inactive.

According to an example embodiment, the differential amplifier may include an inverting port and a non-inverting port and may be configured to receive the second external reference voltage through the inverting port and the output voltage of the second voltage adjusting unit through the non-inverting port.

According to an example embodiment, the NMOS back bias voltage oscillation and pumping unit may be configured to perform an oscillation and pumping operation if the output voltage of the differential amplifier may be activated to a higher level, and may be configured to not perform an oscillation and pumping operation if the output voltage of the differential amplifier may be deactivated to a lower level.

According to an example embodiment, the NMOS back bias voltage may be a negative voltage lower than the ground voltage of the memory integrated circuit device.

According to an example embodiment, the memory integrated circuit device may include a plurality of NMOS transistors to which the NMOS back bias voltage generator is configured to apply the NMOS back bias voltage. the NMOS transistors may be memory cell transistors included in the memory integrated circuit device.

According to an example embodiment, the memory integrated circuit device may further include a differential amplifier that may include a plurality of PMOS transistors and a plurality of NMOS transistors. The PMOS back bias voltage generated by the PMOS back bias voltage generator may be used as back bias voltage for the plurality of PMOS transistors, and the NMOS back bias voltage generated by the NMOS back bias voltage generator may be used as back bias voltage for the plurality of NMOS transistors.

According to an example embodiment, the memory integrated circuit device may further include an input/output sense amplifier that may include a plurality of PMOS transistors and a plurality of NMOS transistors. The PMOS back bias voltage generated by the PMOS back bias voltage generator may be used as back bias voltage for the plurality of PMOS transistors, and the NMOS back bias voltage generated by the NMOS back bias voltage generator may be used as back bias voltage for the plurality of NMOS transistors.

According to an example embodiment, a memory integrated circuit device may include a MOS back bias voltage generating circuit configured to generate a MOS back bias voltage. The MOS back bias voltage generating circuit may include a temperature sensing unit. The temperature sensing unit may be configured to sense a temperature of the memory integrated circuit device and configured to output a digital representation of the sensed temperature. The MOS back bias voltage generating circuit may be configured to generate the MOS back bias voltage in response to the digital representation.

BRIEF DESCRIPTION OF THE DRAWINGS

The above and/or other aspects and advantages will become more apparent and more readily appreciated from the following detailed description of example embodiments taken in conjunction with the accompanying drawings of which.

DETAILED DESCRIPTION OF EXAMPLE EMBODIMENTS

Example embodiments will now be described more fully hereinafter with reference to the accompanying drawings. Embodiments may, however, be in many different forms and should not be construed as being limited to the example embodiments set forth herein. Rather, these example embodiments are provided so that this disclosure will be thorough and complete, and will fully convey the scope to those skilled in the art. In the drawings, the thicknesses of layers and regions may be exaggerated for clarity.

It will be understood that when a component is referred to as being "on," "connected to" or "coupled to" another component, it can be directly on, connected to or coupled to the other component or intervening components may be present. In contrast, when a component is referred to as being "directly on," "directly connected to" or "directly coupled to" another component, there are no intervening components present. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the example embodiments.

Spatially relative terms, such as "beneath," "below," "lower," "above," "upper" and the like, may be used herein for ease of description to describe one component or feature's relationship to another component(s) or feature(s) as illustrated in the drawings. It will be understood that the spatially relative terms are intended to encompass different orientations of the device in use or operation in addition to the orientation depicted in the figures.

The terminology used herein is for the purpose of describing particular example embodiments only and is not intended to be limiting. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, and/or components.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Reference will now be made to example embodiments, which are illustrated in the accompanying drawings, wherein like reference numerals refer to the like components throughout.

Figure 2:
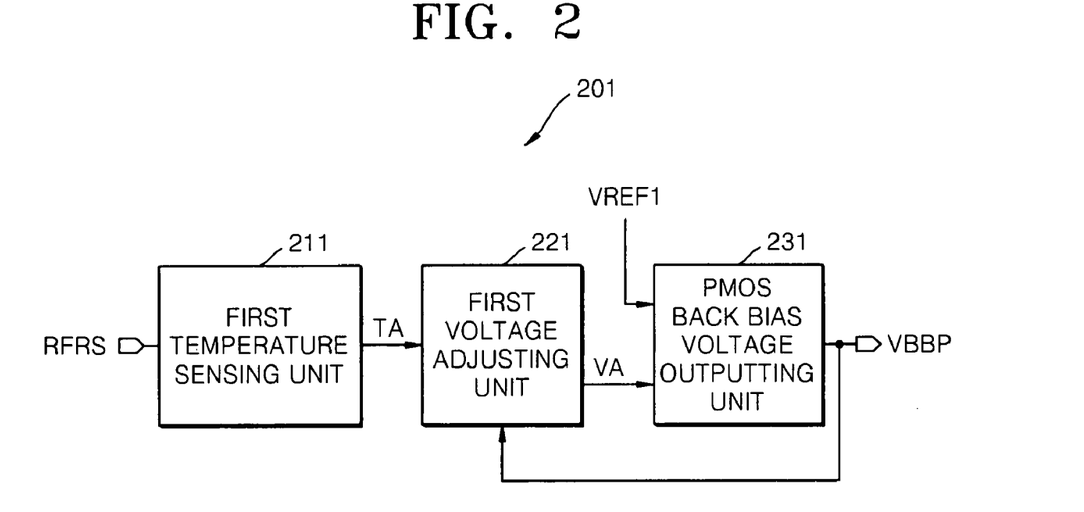
FIG. 2 is a block diagram of a PMOS back bias voltage generator according to an example embodiment.

FIG. 2 is a block diagram of a PMOS back bias voltage generator 201 according to an example embodiment. Referring to FIG. 2, the PMOS back bias voltage generator 201 may receive a refresh signal RFRS, a reference voltage VREF1, and/or a PMOS back bias voltage VBBP, and output the PMOS back bias voltage VBBP. The PMOS back bias voltage generator 201 may include a first temperature sensing unit 211, a first voltage adjusting unit 221, and/or a PMOS back bias voltage outputting unit 231.

The PMOS back bias voltage generator 201 may be included in a memory integrated circuit device. The memory integrated circuit device may include at least one memory bank, each of which may include a plurality of memory cells. If the memory cells are DRAM cells, they may be refreshed at intervals of a desired, or alternatively, a predetermined period of time in response to a refresh signal RFRS.

The first temperature sensing unit 211 may receive the refresh signal RFRS and may sense the temperature of the memory integrated circuit device in response to the refresh signal RFRS. For example, the first temperature sensing unit 211 may be kept inactive in a standby mode. If the refresh signal RFRS becomes active, for example to logic high or logic low, the first temperature sensing unit 211 may be activated, and may sense the temperature of the memory integrated circuit device and output the result of the sensing.

The first temperature sensing unit 211 may be activated only if the refresh signal RFRS is active, so that the standby power consumption of the PMOS back bias voltage generator 201 may be reduced.

Figure 3:
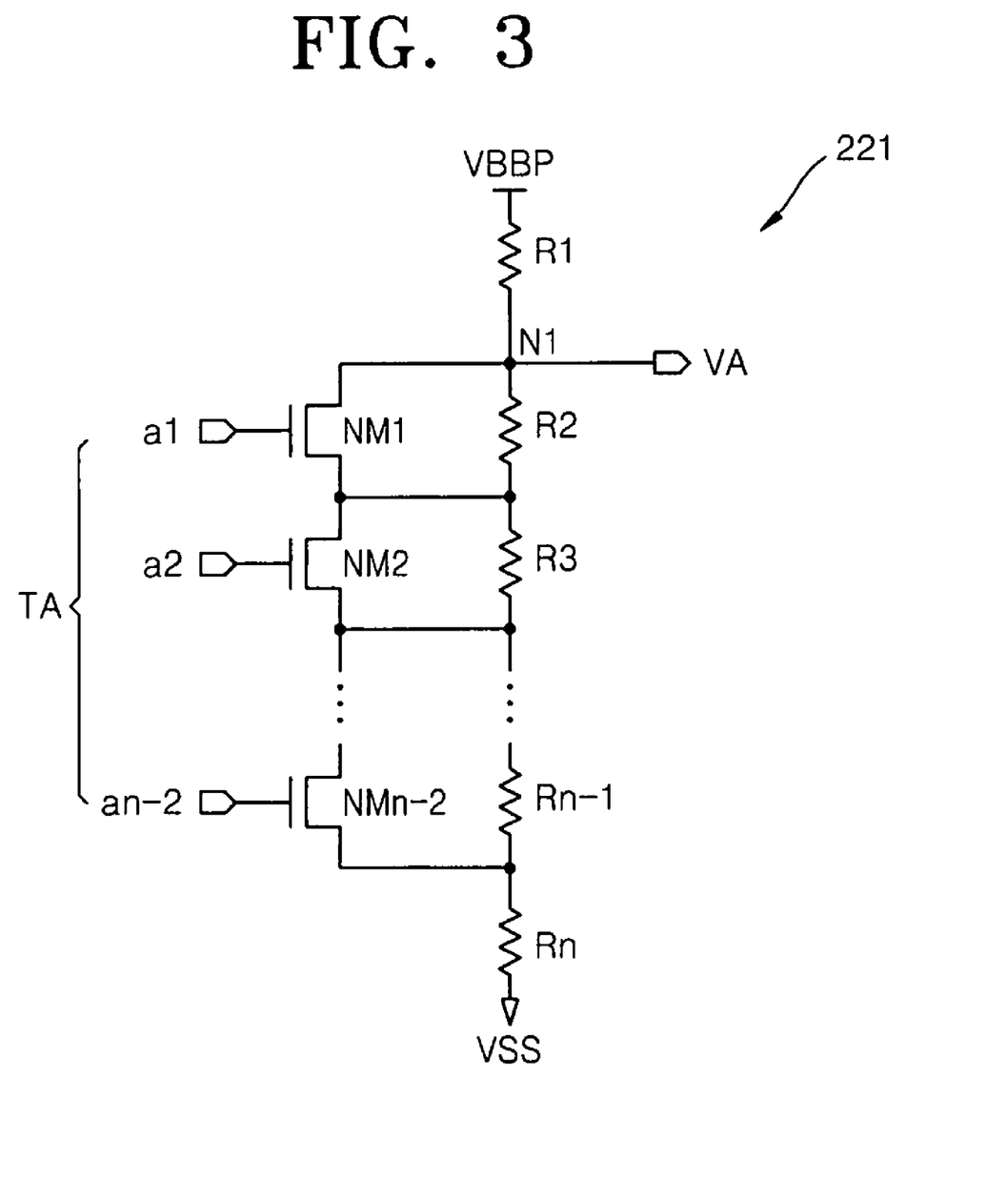
FIG. 3 is a circuit diagram of a first voltage adjusting unit shown in FIG. 2.

The output signal TA of the first temperature sensing unit 211 may be made up of a plurality of digital bits a1 through an−2 as shown in an example embodiment in FIG. 3. The digital bits a1 through an−2 may all be output as "1" if the temperature of the memory integrated circuit device is an upper level, and may all be output as "0" if the temperature of the memory integrated circuit device is a lower level. If the temperature of the memory integrated circuit device is in between the upper and lower values, the digital bits a1 through an−2 may be output as a combination of "1" and "0". For example, the higher the temperature of the memory integrated circuit device, the greater the number of "1" included in the output signal TA of the first temperature sensing unit 211. The lower the temperature of the memory integrated circuit device, the greater the number of "0" included in the output signal TA of the first temperature sensing unit 211.

The first voltage adjusting unit 221 may receive the output signal TA of the first temperature sensing unit 211 and the PMOS back bias voltage VBBP, and may output a voltage VA that varies according to the output signal TA of the first temperature sensing unit 211. For example, the voltage of the output signal VA of the first voltage adjusting unit 221 may decrease if the voltage of the output signal TA of the first temperature sensing unit 211 increases, and may increase if the voltage of the output signal TA of the first temperature sensing unit 211 decreases. The first voltage adjusting unit 221 will be described in greater detail with reference to FIG. 3 later in this disclosure.

The PMOS back bias voltage outputting unit 231 may receive the reference voltage VREF1 and the output signal VA of the first voltage adjusting unit 221 and may output the PMOS back bias voltage VBBP. The PMOS back bias voltage outputting unit 231 may decrease the PMOS back bias voltage VBBP if the voltage of the output signal VA of the first voltage adjusting unit 221 increases, and may increase the PMOS back bias voltage VBBP if the voltage of the output signal VA of the first voltage adjusting unit 221 decreases. The PMOS back bias voltage outputting unit 231 will be described in greater detail with reference to FIG. 4 later in this disclosure.

In an operation of the PMOS back bias voltage generator 201, if the refresh signal RFRS is inactive (e.g., logic low), the first temperature sensing unit 211 may be in a standby state. If the refresh signal RFRS is active (e.g., logic high), the first temperature sensing unit 211 may sense the temperature of the memory integrated circuit device and output an output signal TA to the first voltage adjusting unit 221. If the output signal TA of the first temperature sensing unit 211 increases, the first voltage adjusting unit 221 may decrease an output voltage VA and output the output voltage VA to the PMOS back bias outputting unit 231. If the output signal TA of the first temperature sensing unit 211 decreases, the first voltage adjusting unit 221 may increase the output voltage VA and output the output voltage VA to the PMOS back bias outputting unit 231. The PMOS back bias outputting unit 231 may increase the PMOS back bias voltage VBBP if the output voltage VA of the first voltage adjusting unit 221 is lower than the reference voltage VREF1, and may decrease the PMOS back bias voltage VBBP if the output voltage VA of the first voltage adjusting unit 221 is higher than the reference voltage VREF1.

As a result, if the temperature of the memory integrated circuit device increases, the PMOS back bias voltage VBBP may increase. If the temperature of the memory integrated circuit device decreases, the PMOS back bias voltage VBBP may decrease.

FIG. 3 is a circuit diagram of the first voltage adjusting unit 221 according to an example embodiment. Referring to FIG. 3, the first voltage adjusting unit 221 may include first through n-th resistors R1 through Rn and/or a plurality of NMOS transistors NM1 through NMn−2.

The first resistor through n-th resistors R1 through Rn may be connected in series between the PMOS back bias voltage VBBP and the ground voltage of the memory integrated circuit device.

The NMOS transistors NM1 through NMn−2 may be connected to the second through (n−1)th resistors R2 through Rn−1, respectively, in parallel. The NMOS transistors NM1 through NMn−2 may receive bits a1 through an−2, respectively, of the output signal TA of the first temperature sensing unit 211 through their gates. For example, if the bits a1 through an−2 of the output signal TA are logic high, the NMOS transistors NM1 through NMn−2 may be activated (e.g., turned on). If the bits a1 through an−2 of the output signal TA are logic low, the NMOS transistors NM1 through NMn−2 may be deactivated (e.g., turned off).

The output voltage VA of the first voltage adjusting unit 221 may be output through a connection node N1 between the first and second resistors R1 and R2.

Referring to FIG. 3, if the temperature of the memory integrated circuit device increases and the number of bits among the bits a1 through an−2 that are logic high increases, the number of NMOS transistors that may be activated increases, and the output voltage VA of the first voltage adjusting unit 221 decreases. If the temperature of the memory integrated circuit device decreases and the number of bits among the bits a1 through an−2 that are logic low increases, the number of NMOS transistors that are deactivated increases, and the output voltage VA of the first voltage adjusting unit 221 increases.

Figure 4:
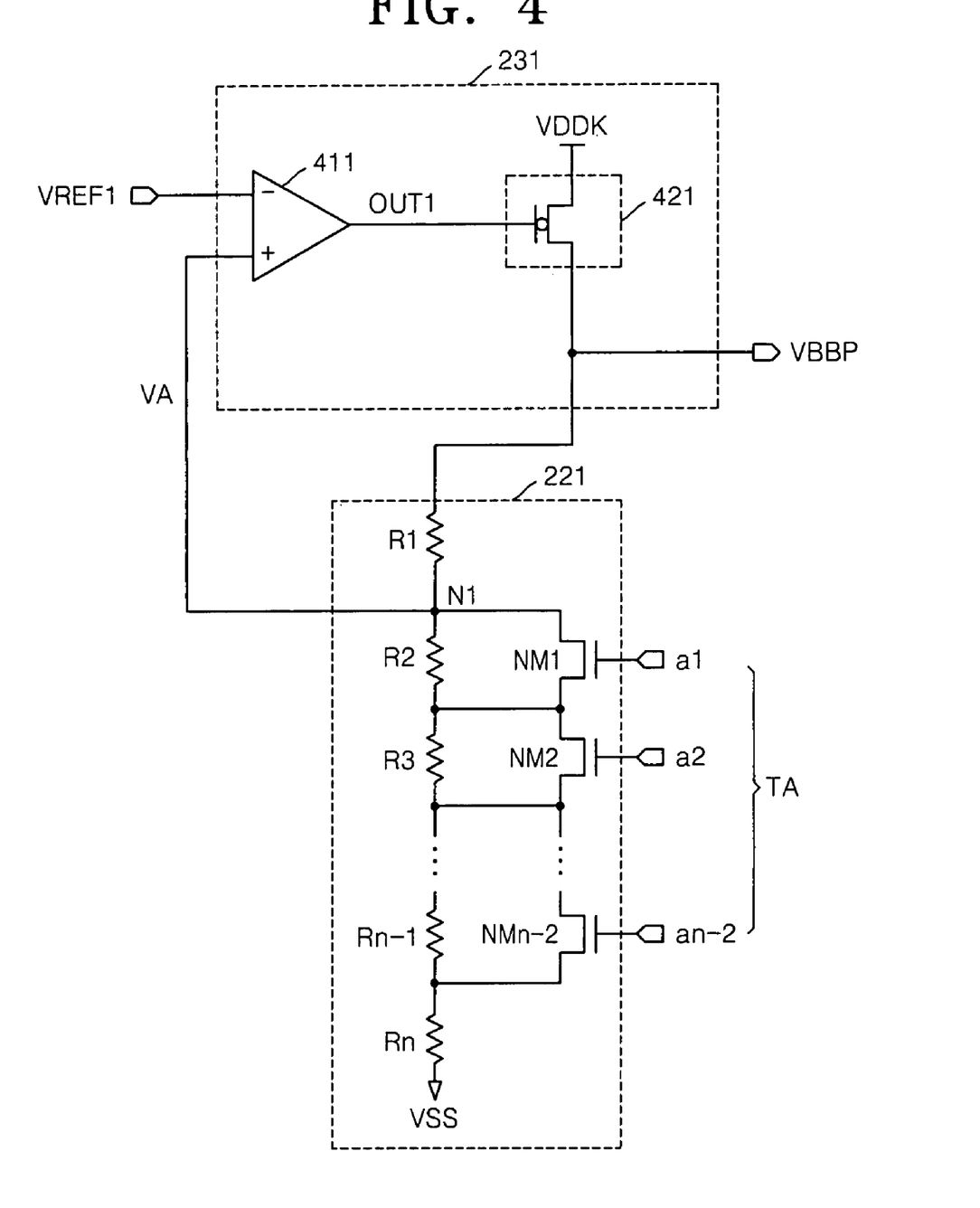
FIG. 4 is a circuit diagram of a PMOS back bias voltage outputting unit that is shown in FIG. 2 and connected to the first voltage adjusting unit of FIG. 3.

FIG. 4 is a circuit diagram of the PMOS back bias voltage outputting unit 231 of FIG. 2 which may be connected to the first voltage adjusting unit 221 shown in FIG. 3. Referring to FIG. 4, the PMOS back bias voltage outputting unit 231 may include a differential amplifier 411 and an output driver 421.

The differential amplifier 411 may receive the reference voltage VREF1 and/or the output voltage VA of the first voltage adjusting unit 221, compare them, and output a result of the comparison. For example, the differential amplifier 411 may include an inverting port (−) and a non-inverting port (+), and may receive the reference voltage VREF1 through the inverting port (−) and the output voltage VA of the first voltage adjusting unit 221 through the non-inverting port (+). The differential amplifier 411 may output a ground voltage VSS as an output voltage OUT1 if the output voltage VA of the first voltage adjusting unit 221 is lower than the reference voltage VREF1, and may output a power supply voltage VDD as the output voltage OUT1 if the output voltage VA of the first voltage adjusting unit 221 is higher than the reference voltage VREF1.

The output driver 421 may receive the output voltage OUT1 of the differential amplifier 411 and output the PMOS back bias voltage VBBP. If the output voltage OUT1 of the differential amplifier 411 is active, for example, the output voltage OUT1 may be the ground voltage VSS, the output driver 421 may be activated and increase the PMOS back bias voltage VBBP. If the output voltage OUT1 of the differential amplifier 411 is inactive, for example, the output voltage OUT1 may be the power supply voltage VDD, the output driver 421 may be deactivated and decrease the PMOS back bias voltage VBBP. For example, if the output voltage OUT1 of the differential amplifier 411 is inactive, the output driver 421 may be deactivated, for example the output driver 421 does not operate. Hence, no voltage may be supplied to the output port of the output driver 421, so that the PMOS back bias voltage VBBP may naturally decrease. Although the PMOS back bias voltage VBBP may not, for example, be reduced by the output driver 421.

The output driver 421 may include a PMOS transistor which receives the output voltage OUT1 of the differential amplifier 411 through its gate and a power supply voltage VDDK through its source and the PMOS transistor outputs the PMOS back bias voltage VBBP through its drain. The power supply voltage VDDK applied to the output driver 421 may be higher than the upper value of the PMOS back bias voltage VBBP. The power supply voltage VDDK applied to the output driver 421 may be one of an external voltage input to the memory integrated circuit device, a wordline boosting voltage applied to wordlines included in each memory cell of the memory integrated circuit device, and a bitline precharge voltage for precharging bitlines connected to the memory cells.

In the operation of the PMOS back bias voltage outputting unit 231, if the output voltage VA of the first voltage adjusting unit 221 decreases compared with the reference voltage VREF1, the differential amplifier 411 may output the ground voltage VSS as the output voltage OUT1. The output driver 421 may be activated, so that the PMOS back bias voltage VBBP may be increased. If the output voltage VA of the first voltage adjusting unit 221 increases compared with the reference voltage VREF1, the differential amplifier 411 may output the power supply voltage VDD as the output voltage OUT1. The output driver 421 may be deactivated, so that the PMOS back bias voltage VBBP may be decreased.

The operations of the first voltage adjusting unit 221 and the PMOS back bias voltage outputting unit 231 will now be described in connection with each other.

If the value of the output signal TA of the first temperature sensing unit 211 increases due to an increase in the temperature of the memory integrated circuit device, the output voltage VA of the first voltage adjusting unit 221 may decrease by a desired, or alternatively, a predetermined amount. The reference voltage VREF1 and/or the output voltage VA of the first voltage adjusting unit 221, which may be input to the differential amplifier 411, may keep about the same level in a standby state. Hence, if the output voltage VA of the first voltage adjusting unit 221 decreases by a desired, or alternatively, a predetermined amount, the output driver 421 may be activated, so that the PMOS back bias voltage VBBP may increase to a desired, or alternatively, a predetermined amount. If the PMOS back bias voltage VBBP increases, the voltage at the node N1 may increase.

If the PMOS back bias voltage VBBP reaches the desired, or alternatively, the predetermined amount, the output voltage VA of the first voltage adjusting unit 221 may be increased by the desired, or alternatively, the predetermined amount, and may become higher than the reference voltage VREF1. As described above, if the output voltage VA of the first voltage adjusting unit 221 exceeds the reference voltage VREF1, the state of the output driver 421 may be changed from an active state to an inactive state, and the PMOS back bias voltage VBBP may start decreasing. If the PMOS back bias voltage VBBP starts decreasing, the output voltage VA of the first voltage adjusting unit 221 may decrease and become lower than the reference voltage VREF1. The state of the output driver 421 may be changed from the inactive state to the active state, and the PMOS back bias voltage VBBP may increase. By repeating these operations, the PMOS back bias voltage VBBP may keep a desired, or alternatively, a predetermined amount. For example, if the temperature of the memory integrated circuit device increases, the PMOS back bias voltage VBBP may be increased by a desired, or alternatively a predetermined amount and the increased amount of the PMOS back bias voltage VBBP may be kept constant.

If the temperature of the memory integrated circuit device decreases, the PMOS back bias voltage VBBP may be decreased by a desired, or alternatively, a predetermined amount and the decreased amount of the PMOS back bias voltage VBBP may be kept constant, by repeating operations opposite to the above-described operations. For example, if the value of the output signal TA of the first temperature sensing unit 211 decreases due to a decrease in the temperature of the memory integrated circuit device, the output voltage VA of the first voltage adjusting unit 221 may increase by a desired, or alternatively, a predetermined amount. The reference voltage VREF1 and/or the output voltage VA of the first voltage adjusting unit 221, which may be input to the differential amplifier 411, may keep about the same level in a standby state. Hence, if the output voltage VA of the first voltage adjusting unit 221 decreases by a desired, or alternatively, a predetermined amount, the output driver 421 may be deactivated, so that the PMOS back bias voltage VBBP may decrease to a desired, or alternatively, a predetermined amount. If the PMOS back bias voltage VBBP decreases, the voltage at the node N1 may decrease.

If the PMOS back bias voltage VBBP reaches the desired, or alternatively, the predetermined amount, the output voltage VA of the first voltage adjusting unit 221 may be decreased by the desired, or alternatively, the predetermined amount and become lower than the reference voltage VREF1. As described above, if the output voltage VA of the first voltage adjusting unit 221 is equal to or lower than the reference voltage VREF1, the state of the output driver 421 may be changed from an inactive state to an active state, and the PMOS back bias voltage VBBP may start increasing. If the PMOS back bias voltage VBBP starts increasing, the output voltage VA of the first voltage adjusting unit 221 may increase again and may become higher than the reference voltage VREF1. The state of the output driver 421 may be changed from the active state to the inactive state, and the PMOS back bias voltage VBBP may decrease. By repeating these operations, the PMOS back bias voltage VBBP may keep a desired, or alternatively, a predetermined amount.

Figure 5:
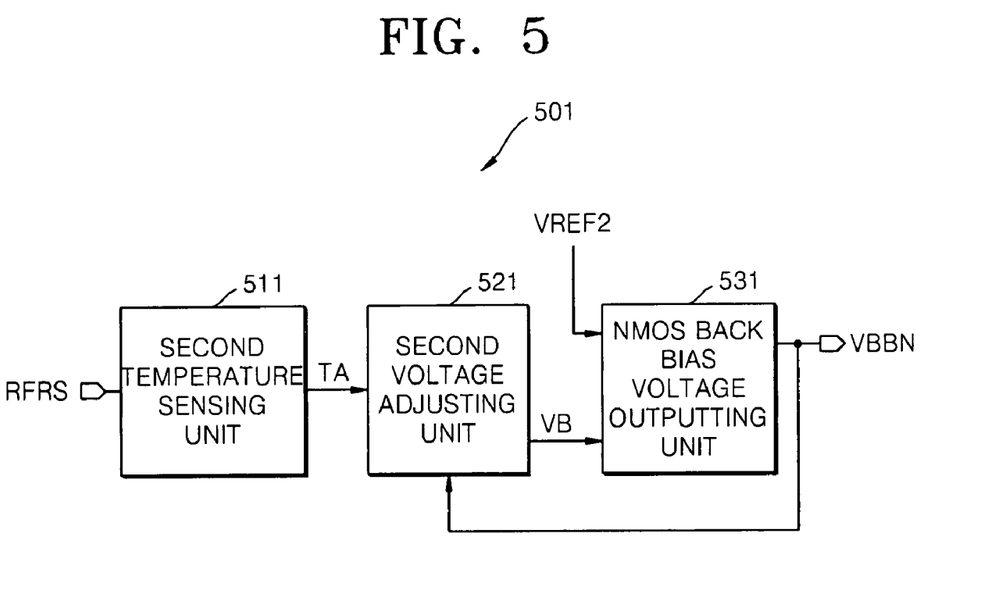
FIG. 5 is a block diagram of an NMOS back bias voltage generator according to an example embodiment.

FIG. 5 is a block diagram of an NMOS back bias voltage generator 501 according to another example embodiment. Referring to FIG. 5, the NMOS back bias voltage generator 501 may receive a refresh signal RFRS, a reference voltage VREF2, and/or a NMOS back bias voltage VBBN, and/or output a NMOS back bias voltage VBBN. The NMOS back bias voltage generator 201 may include a second temperature sensing unit 511, a second voltage adjusting unit 521, and/or a NMOS back bias voltage outputting unit 531. The NMOS back bias voltage generator 501 may be included in a memory integrated circuit device.

The NMOS back bias voltage VBBN may be a negative voltage lower than a ground voltage VSS, and a decrease of the NMOS back bias voltage VBBN may denote an increase of the absolute value of the NMOS back bias voltage VBBN, while an increase of the NMOS back bias voltage VBBN may denote a decrease of the absolute value of the NMOS back bias voltage VBBN.

The second temperature sensing unit 511 may be the same in its function and operation as the first temperature sensing unit 211 of FIG. 2, so a description thereof will be omitted.

The second voltage adjusting unit 521 may receive the output signal TA of the second temperature sensing unit 511 and the NMOS back bias voltage VBBN, and may output a voltage VB that varies according to the output signal TA of the second temperature sensing unit 511. For example, the voltage VB output by the second voltage adjusting unit 521 may increase if the value of the output signal TA of the second temperature sensing unit 511 increases, and may decrease if the value of the first temperature sensing unit 211 decreases. The second voltage adjusting unit 521 will be described in greater detail with reference to FIG. 6 later in this disclosure.

The NMOS back bias voltage outputting unit 531 may receive the reference voltage VREF2 and the output voltage VB of the second voltage adjusting unit 521 and output the NMOS back bias voltage VBBN. The NMOS back bias voltage outputting unit 531 may decrease the NMOS back bias voltage VBBN if the output voltage VB of the second voltage adjusting unit 521 increases, and may increase the NMOS back bias voltage VBBN if the output voltage VB of the second voltage adjusting unit 521 decreases. The NMOS back bias voltage outputting unit 531 will be described in greater detail with reference to FIG. 7 later in this disclosure.

In the operation of the NMOS back bias voltage generator 501, if the refresh signal RFRS is active, the second temperature sensing unit 511 may sense the temperature of the memory integrated circuit device and may output the output signal TA to the second voltage adjusting unit 521. If the output signal TA of the second temperature sensing unit 511 increases, the second voltage adjusting unit 521 may increase the output voltage VB and output the output voltage VB to the NMOS back bias outputting unit 531. If the output signal TA of the second temperature sensing unit 511 decreases, the second voltage adjusting unit 521 may decrease the output voltage VB and output the output voltage VB to the NMOS back bias outputting unit 531. The NMOS back bias outputting unit 531 may decrease the NMOS back bias voltage VBBN if the output voltage VB of the second voltage adjusting unit 521 is higher than the reference voltage VREF2, and may increase the NMOS back bias voltage VBBN if the output voltage VB of the second voltage adjusting unit 521 is lower than the reference voltage VREF2.

As a result, if the temperature of the memory integrated circuit device increases, the NMOS back bias voltage VBBN may decrease. If the temperature of the memory integrated circuit device decreases, the NMOS back bias voltage VBBN may increase.

Figure 6:
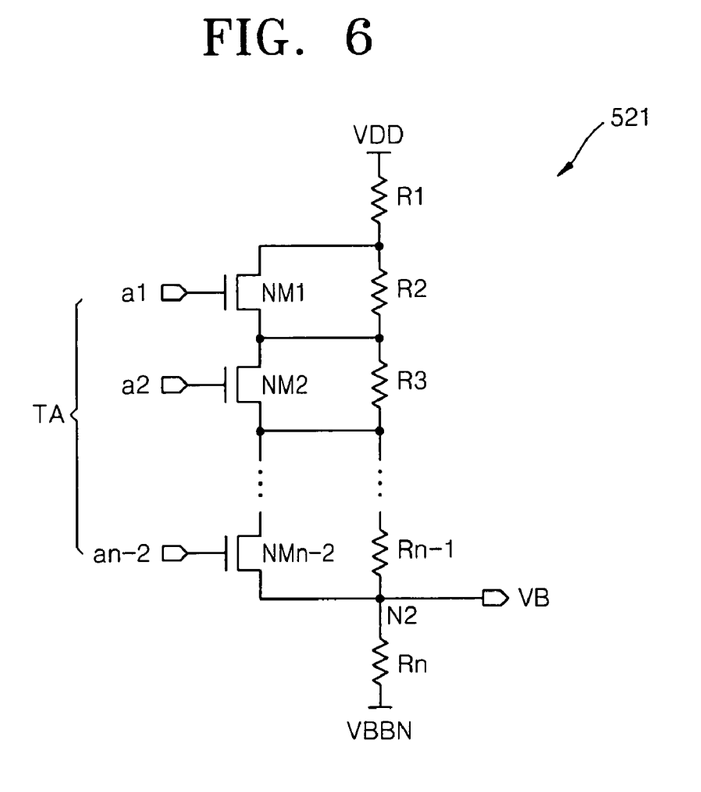
FIG. 6 is a circuit diagram of a second voltage adjusting unit shown in FIG. 5.

FIG. 6 is a circuit diagram of example embodiments of the second voltage adjusting unit 521. Referring to FIG. 6, the second voltage adjusting unit 521 may include first through n-th resistors R1 through Rn and/or a plurality of NMOS transistors NM1 through NMn−2.

The first through n-th resistors R1 through Rn may be connected in series between the ground voltage VDD of the memory integrated circuit device and the NMOS back bias voltage VBBN.

The NMOS transistors NM1 through NMn−2 may be connected to the second through (n−1)th resistors R2 through Rn−1, respectively, in parallel. The NMOS transistors NM1 through NMn−2 may receive bits a1 through an−2, respectively, of the output signal TA of the second temperature sensing unit 511 through their gates. Hence, if the output signal TA of the second temperature sensing unit 511 is logic high, the NMOS transistors NM1 through NMn−2 may be activated (e.g., turned on). If the output signal TA of the second temperature sensing unit 511 is logic low, the NMOS transistors NM1 through NMn−2 may be deactivated (e.g., turned off).

The output voltage VB of the second voltage adjusting unit 521 may be output through a connection node N2 between the (n−1)th and n-th resistors R(n−1) and Rn.

Referring to FIG. 6, if the temperature of the memory integrated circuit device increases and the number of bits among the bits a1 through an−2 that are logic high increases, the number of NMOS transistors that may be activated increases. The output voltage VB of the second voltage adjusting unit 521 may increase. If the temperature of the memory integrated circuit device decreases and the number of bits among the bits a1 through an−2 that are logic low increases, the number of NMOS transistors that may be deactivated may increase. The output voltage VB of the second voltage adjusting unit 521 may decrease.

Figure 7:
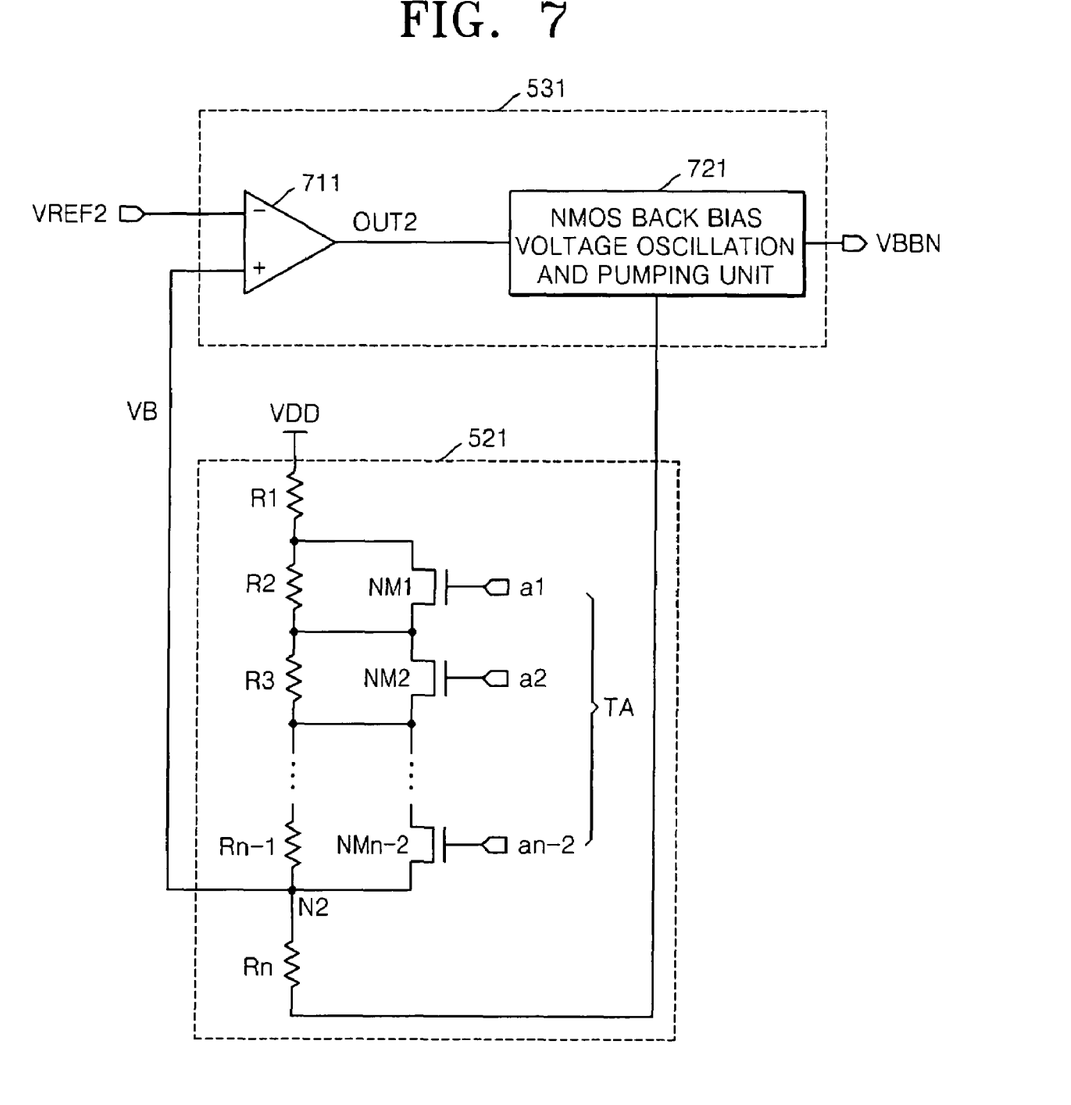
FIG. 7 is a circuit diagram of an NMOS back bias voltage outputting unit that is shown in FIG. 5 and connected to the second voltage adjusting unit of FIG. 6.

FIG. 7 is a circuit diagram of example embodiments of the NMOS back bias voltage outputting unit 531 of FIG. 5 which may be connected to the second voltage adjusting unit 521 shown in FIG. 6. Referring to FIG. 7, the NMOS back bias voltage outputting unit 531 may include a differential amplifier 711 and/or an NMOS back bias voltage oscillation and pumping unit 721.

The differential amplifier 711 may receive the reference voltage VREF2 and the output voltage VB of the second voltage adjusting unit 521, compare them, and output a result of the comparison. For example, the differential amplifier 711 may include an inverting port (−) and a non-inverting port (+), and may receive the reference voltage VREF2 through the inverting port (−) and the output voltage VB of the second voltage adjusting unit 521 through the non-inverting port (+). The differential amplifier 711 may output a ground voltage VSS as an output voltage OUT2 if the output voltage VB of the second voltage adjusting unit 521 is lower than the reference voltage VREF2, and may output a power supply voltage VDD as the output voltage OUT2 if the output voltage VB of the second voltage adjusting unit 521 is higher than the reference voltage VREF2.

The NMOS back bias voltage oscillation and pumping unit 721 may receive the output voltage OUT2 of the differential amplifier 711 and output the NMOS back bias voltage VBBN. If the output voltage OUT2 of the differential amplifier 711 is active, for example the output voltage OUT2 may be the power supply voltage VDD, the NMOS back bias voltage oscillation and pumping unit 721 may be activated and decrease the NMOS back bias voltage VBBN. If the output voltage OUT2 of the differential amplifier 711 is inactive, for example the output voltage OUT2 may be the ground voltage VSS, the NMOS back bias voltage oscillation and pumping unit 721 may be deactivated and increase the NMOS back bias voltage VBBN. For example, if the output voltage OUT2 of the differential amplifier 711 is inactive, the NMOS back bias voltage oscillation and pumping unit 721 may be deactivated, for example the NMOS back bias voltage oscillation and pumping unit 721 may not operate. Hence, no voltage may be supplied to the output port of the NMOS back bias voltage oscillation and pumping unit 721, so that the NMOS back bias voltage VBBN may naturally increase. Although the NMOS back bias voltage VBBN may not, for example, be increased by the NMOS back bias voltage oscillation and pumping unit 721. For example, because the NMOS back bias voltage VBBN may be a negative voltage lower than the ground voltage VSS, the NMOS back bias voltage VBBN may be increased to the ground voltage VSS by a physical phenomenon if no voltage is applied to the output port of the NMOS back bias voltage oscillation and pumping unit 721.

In the operation of the NMOS back bias voltage outputting unit 531, if the output voltage VB of the second voltage adjusting unit 521 is higher than the reference voltage VREF2, the differential amplifier 711 may output the power supply voltage VDD as the output voltage OUT2. The NMOS back bias voltage oscillation and pumping unit 721 may be activated, so that the NMOS back bias voltage VBBN may be decreased. If the output voltage VB of the second voltage adjusting unit 521 is lower than the reference voltage VREF2, the differential amplifier 711 may output the ground voltage VSS as the output voltage OUT2. The NMOS back bias voltage oscillation and pumping unit 721 may be deactivated, so that the NMOS back bias voltage VBBN may be decreased.

The operations of the second voltage adjusting unit 521 and the NMOS back bias voltage outputting unit 531 will now be described as linked together.

If the value of the output signal TA of the second temperature sensing unit 511 increases due to an increase in the temperature of the memory integrated circuit device, the output voltage VB of the second voltage adjusting unit 521 may increase by a desired, or alternatively, a predetermined amount. The reference voltage VREF2 and/or the output voltage VB of the second voltage adjusting unit 521, which are input to the differential amplifier 711, may be kept constant in a standby state. Hence, if the output voltage VB of the second voltage adjusting unit 521 increases by a desired, or alternatively a predetermined amount, the NMOS back bias voltage oscillation and pumping unit 721 may be activated, so that the NMOS back bias voltage VBBN may decrease to a desired, or alternatively, a predetermined amount of voltage. If the NMOS back bias voltage VBBN decreases, the voltage at the node N2 may decrease.

If the NMOS back bias voltage VBBN decreases, the output voltage VB of the second voltage adjusting unit 521 may be decreased and may become lower than the reference voltage VREF2. As described above, if the output voltage VB of the second voltage adjusting unit 521 is lower than the reference voltage VREF2, the state of the NMOS back bias voltage oscillation and pumping unit 721 may be changed from an active state to an inactive state, and the NMOS back bias voltage VBBN may start increasing. If the NMOS back bias voltage VBBN starts increasing, the output voltage VB of the second voltage adjusting unit 521 may increase and may become higher than the reference voltage VREF2. The state of the NMOS back bias voltage oscillation and pumping unit 721 may be changed from the inactive state to the active state, and the NMOS back bias voltage VBBN may decrease. By repeating these operations, the NMOS back bias voltage VBBN may keep a desired, or alternatively, a predetermined amount. For example, if the temperature of the memory integrated circuit device increases, the NMOS back bias voltage VBBN may be decreased by a desired, or alternatively, a predetermined amount and the decreased amount of the PMOS back bias voltage VBBP may be kept constant.

If the temperature of the memory integrated circuit device decreases, the NMOS back bias voltage VBBN may be increased by a desired, or alternatively, a predetermined amount and the increased amount of the NMOS back bias voltage VBBN may be kept constant, by repeating operations opposite to the above-described operations. For example, if the value of the output signal TA of the second temperature sensing unit 511 decreases due to a decrease in the temperature of the memory integrated circuit device, the output voltage VB of the second voltage adjusting unit 521 may decrease by a desired, or alternatively, a predetermined amount. The reference voltage VREF2 and the output voltage VB of the second voltage adjusting unit 521, which are input to the differential amplifier 711, may be kept about constant during a standby state. Hence, if the output voltage VB of the second voltage adjusting unit 521 decreases by a desired, or alternatively, a predetermined amount, the NMOS back bias voltage oscillation and pumping unit 721 may be deactivated, so that the NMOS back bias voltage VBBN may increase to a desired, or alternatively, a predetermined amount. If the NMOS back bias voltage VBBN increases, the voltage at the node N2 may increase.

If the NMOS back bias voltage VBBN reaches the desired, or alternatively, the predetermined amount, the output voltage VB of the second voltage adjusting unit 521 may be increased by the desired, or alternatively, the predetermined amount and become higher than the reference voltage VREF2. As described above, if the output voltage VB of the second voltage adjusting unit 521 exceeds the reference voltage VREF2, the state of the NMOS back bias voltage oscillation and pumping unit 721 may be changed from an inactive state to an active state, and the NMOS back bias voltage VBBN may start decreasing. If the NMOS back bias voltage VBBN starts decreasing, the output voltage VB of the second voltage adjusting unit 521 may decrease again and become lower than the reference voltage VREF2. The state of the NMOS back bias voltage oscillation and pumping unit 721 may be changed from the active state to the inactive state, and the NMOS back bias voltage VBBN may increase. By repeating these operations, the NMOS back bias voltage VBBN may keep a desired, or alternatively, a predetermined amount.

Figure 8:
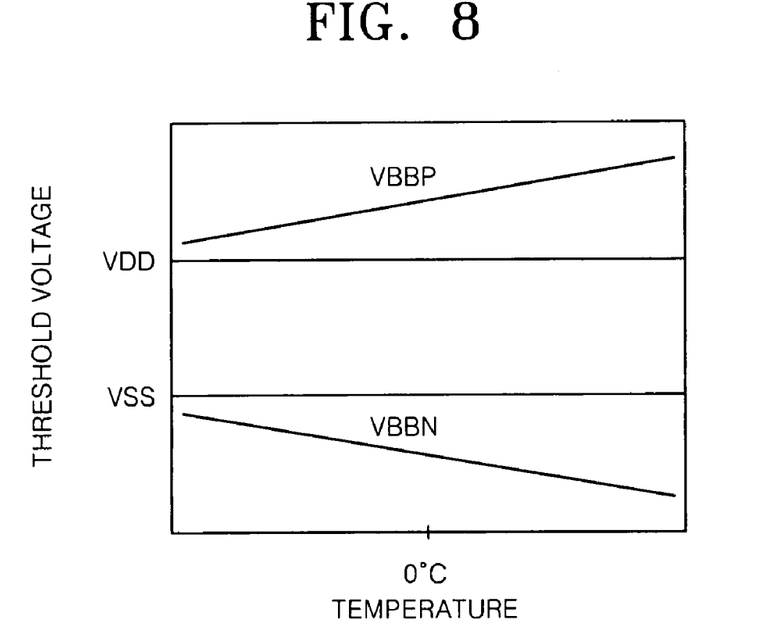
FIG. 8 is an example graph showing variations of a PMOS back bias voltage shown in FIG. 2 and an NMOS back bias voltage shown in FIG. 5.

FIG. 8 is an example graph showing variations of the PMOS back bias voltage VBBP and the NMOS back bias voltage VBBN. Referring to FIG. 8, the PMOS back bias voltage VBBP may be higher than the power supply voltage VDD of the memory integrated circuit device, may increase with an increase of the temperature of the memory integrated circuit device, and may decrease with a decrease of the temperature of the memory integrated circuit device. The NMOS back bias voltage VBBN may be lower than the ground voltage VSS of the memory integrated circuit device, may decrease with an increase of the temperature of the memory integrated circuit device, and may increase with a decrease of the temperature memory integrated circuit device.

Figure 9:
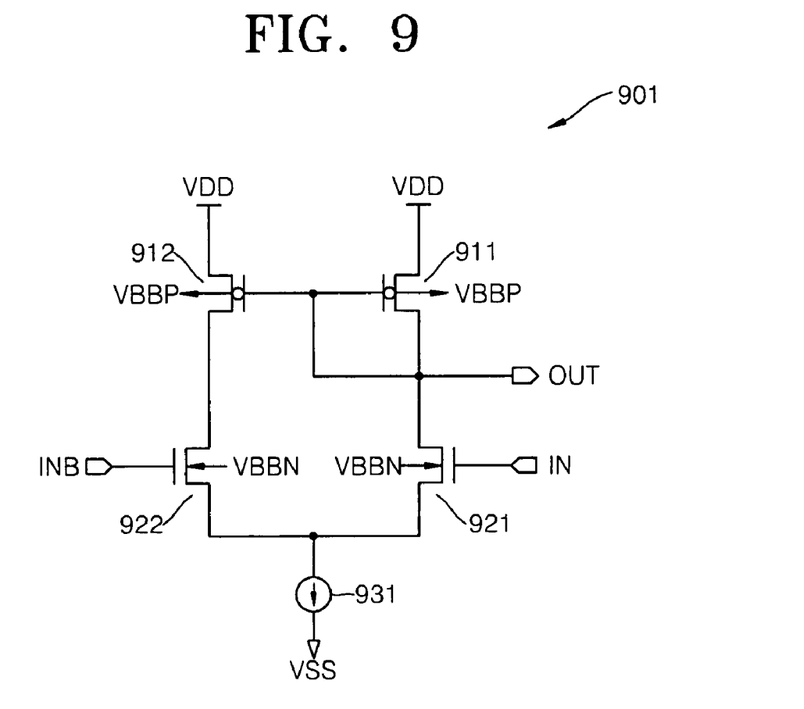
FIG. 9 is a circuit diagram of a differential amplifier according to an example embodiment.

FIG. 9 is a circuit diagram of a differential amplifier 901 according to an example embodiment. Referring to FIG. 9, the differential amplifier 901 may include a plurality of PMOS transistors 911 and 912, a plurality of NMOS transistors 921 and 922, and/or a current source 931. The PMOS transistors 911 and 912 may receive the PMOS back bias voltage VBBP at their bulk, and the NMOS transistors 921 and 922 may receive the NMOS back bias voltage VBBN at their bulk.

Referring to FIG. 9, if the power supply voltage VDD is lower, the threshold voltages of the PMOS transistors 911 and 912 and the NMOS transistors 921 and 922 may increase with a decrease in the temperature of the memory integrated circuit device, because the drain saturation currents of the PMOS transistors 911 and 912 and the NMOS transistors 921 and 922 may increase as the temperature decreases. The drain saturation currents of the PMOS transistors 911 and 912 and the NMOS transistors 921 and 922 may be proportional to the thresholds of the PMOS transistors 911 and 912 and the NMOS transistors 921 and 922, respectively. If the threshold voltages of the PMOS transistors 911 and 912 and the NMOS transistors 921 and 922 increase, the operating speeds of the PMOS transistors 911 and 922 and the NMOS transistors 921 and 922, respectively, may decrease. However, the PMOS back bias voltage VBBP may decrease with a decrease in the temperature, and is used as back bias voltage for the PMOS transistors 911 and 912; and the NMOS back bias voltage VBBN may increase with a decrease in the temperature, and is used as back bias voltage for the NMOS transistors 921 and 922. Accordingly, the thresholds of these transistors may be decreased instead of increased. Hence, even at a lower temperature, the operating speeds of the PMOS transistors 911 and 912 and the NMOS transistors 921 and 922 may not be decreased.

As the temperature increases, the leakage currents of the PMOS transistors 911 and 912 and the NMOS transistors 921 and 922 may increase. To reduce the increase in the leakage currents, the PMOS back bias voltage VBBP may be used as the back bias voltages of the PMOS transistors 911 and 912, and the NMOS back bias voltage VBBN may be used as the back bias voltages of the NMOS transistors 921 and 922, so that the thresholds of these transistors may be increased instead of decreased. Hence, even if the temperature of the memory integrated circuit device increases, the leakage currents of the PMOS transistors 911 and 912 and the NMOS transistors 921 and 922 may not increase due to an increase of the drain saturation currents of the PMOS transistors 911 and 912 and the NMOS transistors 921 and 922.

Figure 10:
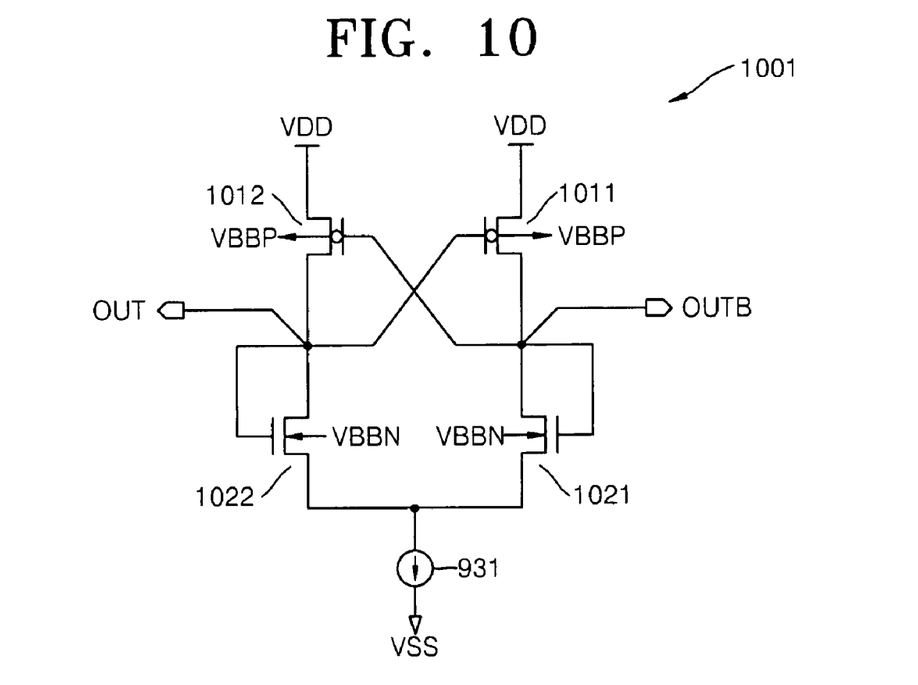
FIG. 10 is a circuit diagram of an input/output sense amplifier according to an example embodiment.

FIG. 10 is a circuit diagram of an input/output sense amplifier 1001 according to an example embodiment. Referring to FIG. 10, the input/output sense amplifier 1001 may include a plurality of PMOS transistors 1011 and 1012, a plurality of NMOS transistors 1021 and 1022, and/or a current source 1031. The PMOS transistors 1011 and 1012 may receive the PMOS back bias voltage VBBP at their bulk, and the NMOS transistors 1021 and 1022 may receive the NMOS back bias voltage VBBN at their bulk.

As described above with reference to FIG. 9, the PMOS back bias voltage VBBP, that may decrease with a decrease in the temperature, may be used as back bias voltages of the PMOS transistors 1011 and 1012. The NMOS back bias voltage VBBN, that may increase with a decrease in the temperature, may be used as back bias voltages of the NMOS transistors 1021 and 1022. Accordingly, operating speed of the PMOS transistors 1011 and 1012 and the NMOS transistors 1021 and 1022 may not be decreased at a lower temperature. If the temperature of the memory integrated circuit device increases, the leakage currents of the PMOS transistors 1011 and 1012 and the NMOS transistors 1021 and 1022 may not increase.

Figure 11:
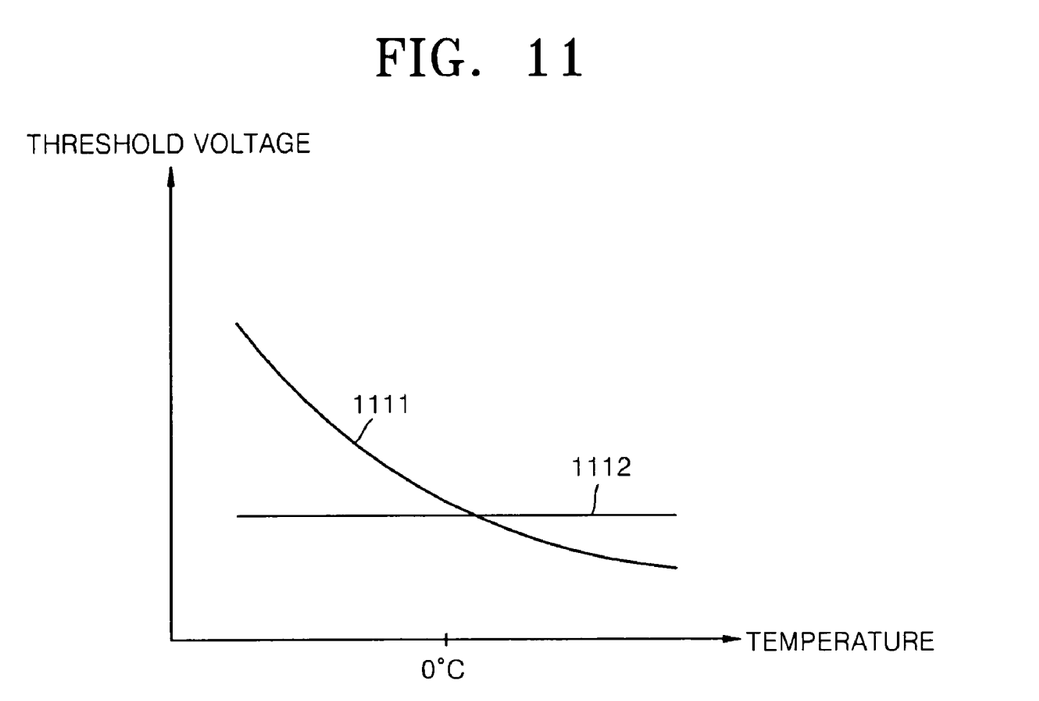
FIG. 11 is an example graph of a threshold voltage of a MOS transistor included in a memory integrated circuit device according to an example embodiment versus a temperature.

FIG. 11 is a graph of a threshold voltage 1112 of a MOS transistor included in a memory integrated circuit device according to an example embodiment and a threshold voltage 1111 of a MOS transistor included in a conventional memory integrated circuit device versus temperature. Referring to FIG. 11, the threshold voltage 1112 may be lower than the threshold voltage 1111 at a lower temperature.

As described above, because the threshold voltage of a MOS transistor may decrease at a lower temperature, the operating speed of a memory integrated circuit device may not be decreased even if the memory integrated circuit device uses a lower power supply voltage VDD.

The power consumption of the memory integrated circuit device may be reduced by using the lower power supply voltage VDD.

The PMOS back bias voltage generator 201 may generate the PMOS back bias voltage VBBP that may decrease with a decrease in the temperature. The PMOS back bias voltage VBBP may be used as the back bias voltage of the PMOS transistors 911, 912, 1011, and 1012. The NMOS back bias voltage generator 501 may generate the NMOS back bias voltage VBBN that may increase with a decrease in the temperature. The NMOS back bias voltage VBBN may be used as the back bias voltage of the NMOS transistors 921, 922, 1021, and 1022. Hence, even if the temperature is lower, the operating speeds of the PMOS transistors 911, 912, 1011, and 1012 and the NMOS transistors 921, 922, 1021, and 1022 may not be decreased.

The PMOS back bias voltage generator 201 may generate the PMOS back bias voltage VBBP that may increase with an increase in the temperature. The PMOS back bias voltage VBBP may be used as the back bias voltages of the PMOS transistors 911, 912, 1011, and 1012. The NMOS back bias voltage generator 501 may generate the NMOS back bias voltage VBBN that may decrease with an increase in the temperature. The NMOS back bias voltage VBBN may be used as the back bias voltages of the NMOS transistors 921, 922, 1021, and 1022. Hence, even if the temperature is higher, the leakage currents of the PMOS transistors 911, 912, 1011, and 1012 and the NMOS transistors 921, 922, 1021, and 1022 may not be increased.

Although example embodiments have been shown and described in this specification and figures, it would be appreciated by those skilled in the art that changes may be made to the illustrated and/or described example embodiments without departing from their principles and spirit.

What is claimed is:

1. A memory integrated circuit device comprising:
   a MOS back bias voltage generator configured to generate a MOS back bias voltage, the MOS back bias voltage generator including,
     a first temperature sensing unit configured to sense a temperature of the memory integrated circuit device;
     a first voltage adjusting unit configured to receive an output signal of the first temperature sensing unit and configured to output a voltage based on the output signal of the first temperature sensing unit such that the voltage output changes based on changes in the sensed temperature; and
   a MOS back bias voltage outputting unit configured to receive the voltage output by the first voltage adjusting unit and configured to output the MOS back bias voltage based on the voltage output by the first voltage adjusting unit,
   wherein the first voltage adjusting unit includes a first resistor configured to receive the MOS back bias voltage, an n-th resistor configured to receive a ground voltage of the memory integrated circuit device, second through (n−1)th resistors connected between the first resistor and the n-th resistor, and a plurality of MOS transistors connected to the second through (n−1)th resistors, respectively, in parallel,
   the plurality of MOS transistors are configured to receive respective portions of the output signal of the first temperature sensing unit through their gates, and
   the output voltage of the first voltage adjusting unit is output through a connection node between the first and second resistors.

2. The memory integrated circuit device of claim 1, wherein
   the MOS back bias voltage generator is a PMOS back bias voltage generator,
   the MOS back bias voltage is a PMOS back bias voltage,
   the MOS back bias voltage outputting unit is a PMOS back bias voltage outputting unit, and
   the first voltage adjusting unit is configured to adjust the voltage output such that the PMOS back bias voltage outputting unit increases the PMOS back bias voltage if the sensed temperature increases, and decreases the PMOS back bias voltage if the sensed temperature decreases.

3. The memory integrated circuit device of claim 2, wherein the first temperature sensing unit is configured to receive a refresh signal for refreshing a plurality of memory cells included in the memory integrated circuit device, and is configured to be activated to sense the temperature of the memory integrated circuit device if the refresh signal is active.

4. The memory integrated circuit device of claim 2, wherein the output signal of the first temperature sensing unit includes a plurality of digital bits.

5. The memory integrated circuit device of claim 4, wherein the first temperature sensing unit is configured to output each of the plurality of digital bits as "1" if the temperature of the memory integrated circuit device is an upper level, and is configured to output each of the plurality of digital bits as "0" if the temperature of the memory integrated circuit device is a lower level.

6. The memory integrated circuit device of claim 1, wherein the plurality of MOS transistors are a plurality of NMOS transistors.

7. The memory integrated circuit device of claim 2, wherein the PMOS back bias voltage outputting unit comprises:
   a differential amplifier configured to receive a first external reference voltage and the output voltage of the first voltage adjusting unit; and
   an output driver configured to receive a voltage output by the differential amplifier, configured to output the PMOS back bias voltage, configured to increase the PMOS back bias voltage if the output voltage of the differential amplifier is active, and configured to decrease the PMOS back bias voltage if the output voltage of the differential amplifier is inactive.

8. The memory integrated circuit device of claim 7, wherein the differential amplifier includes an inverting port and a non-inverting port and is configured to receive the first external reference voltage through the inverting port and the output voltage of the first voltage adjusting unit through the non-inverting port.

9. The memory integrated circuit device of claim 7, wherein the output driver includes a PMOS transistor configured to receive the output voltage of the differential amplifier through its gate and a power supply voltage through its source, and configured to output the PMOS back bias voltage through its drain.

10. The memory integrated circuit device of claim 9, wherein the power supply voltage applied to the output driver is higher than an upper value of the PMOS back bias voltage.

11. The memory integrated circuit device of claim 9, wherein the power supply voltage applied to the output driver is one of an external voltage input to the memory integrated circuit device, a wordline boosting voltage for boosting the voltages of wordlines included in the memory integrated circuit device, and a bitline precharge voltage for precharging bitlines included in the memory integrated circuit device.

12. The memory integrated circuit device of claim 2, wherein the PMOS back bias voltage is higher than a power supply voltage of the memory integrated circuit device.

13. The memory integrated circuit device of claim 1, further comprising:

a plurality of MOS transistors, wherein the MOS back bias voltage generator is configured to apply the MOS back bias voltage to the plurality of MOS transistors.

14. A memory integrated circuit device comprising:
a MOS back bias voltage generator configured to generate a MOS back bias voltage, the MOS back bias voltage generator including,
a first temperature sensing unit configured to sense a temperature of the memory integrated circuit device;
a first voltage adjusting unit configured to receive an output signal of the first temperature sensing unit and configured to output a voltage based on the output signal of the first temperature sensing unit such that the voltage output changes based on changes in the sensed temperature; and
a MOS back bias voltage outputting unit configured to receive the voltage output by the first voltage adjusting unit and configured to output the MOS back bias voltage based on the voltage output by the first voltage adjusting unit,
wherein the first voltage adjusting unit includes a first resistor configured to receive a power supply voltage of the memory integrated circuit device, an n-th resistor configured to receive the MOS back bias voltage, second through (n−1)th resistors connected between the first resistor and the n-th resistor, a plurality of MOS transistors connected to the second through (n−1)th resistors, respectively, in parallel,
the plurality of MOS transistors are configured to receive respective portions of the output signal of the first temperature sensing unit through their gates, and
the output voltage of the first voltage adjusting unit is output through a connection node between the n-th and (n−1)th resistors.

15. The memory integrated circuit device of claim 14, wherein
the MOS back bias voltage generator is a NMOS back bias voltage generator,
the MOS back bias voltage is a NMOS back bias voltage,
the MOS back bias voltage outputting unit is a NMOS back bias voltage outputting unit, and
the first voltage adjusting unit is configured to adjust the voltage output such that the NMOS back bias voltage outputting unit decreases the NMOS back bias voltage if the sensed temperature increases, and increases the NMOS back bias voltage if the sensed temperature decreases.

16. The memory integrated circuit device of claim 15, wherein the first temperature sensing unit is configured to receive a refresh signal for refreshing a plurality of memory cells included in the memory integrated circuit device, and is configured to be activated to sense the temperature of the memory integrated circuit device if the refresh signal is active.

17. The memory integrated circuit device of claim 15, wherein the output signal of the first temperature sensing unit includes a plurality of digital bits.

18. The memory integrated circuit device of claim 17, wherein the first temperature sensing unit is configured to output each of the plurality of digital bits as "1" if the temperature of the memory integrated circuit device is an upper level, and is configured to output each of the plurality of digital bits as "0" if the temperature of the memory integrated circuit device is a lower level.

19. The memory integrated circuit device of claim 15, wherein the plurality of MOS transistors are a plurality of NMOS transistors.

20. The memory integrated circuit device of claim 15, wherein the NMOS back bias voltage outputting unit comprises:
a differential amplifier configured to receive a first external reference voltage and the output voltage of the first voltage adjusting unit; and
an NMOS back bias voltage oscillation and pumping unit configured to receive a voltage output by the differential amplifier, configured to output the NMOS back bias voltage, configured to decrease the NMOS back bias voltage if the output voltage of the differential amplifier is active, and configured to increase the NMOS back bias voltage if the output voltage of the differential amplifier is inactive.

21. The memory integrated circuit device of claim 20, wherein the differential amplifier includes an inverting port and a non-inverting port and is configured to receive the first external reference voltage through the inverting port and the output voltage of the first voltage adjusting unit through the non-inverting port.

22. The memory integrated circuit device of claim 20, wherein the NMOS back bias voltage oscillation and pumping unit is configured to perform an oscillation and pumping operation if the output voltage of the differential amplifier is activated, and is configured to not perform the oscillation and pumping operation if the output voltage of the differential amplifier is deactivated.

23. The memory integrated circuit device of claim 15, wherein the NMOS back bias voltage is a negative voltage lower than the ground voltage of the memory integrated circuit device.

24. The memory integrated circuit device of claim 15, further including a plurality of NMOS transistors to which the NMOS back bias voltage generator is configured to apply the NMOS back bias voltage, wherein the NMOS transistors are memory cell transistors included in the memory integrated circuit device.

25. The memory integrated circuit device of claim 14, further comprising:
a PMOS back bias voltage generator configured to generate a PMOS back bias voltage, the PMOS back bias voltage generator including,
a second temperature sensing unit configured to sense the temperature of the memory integrated circuit device;
a second voltage adjusting unit configured to receive an output signal of the second temperature sensing unit and configured to output a voltage based on the output signal of the second temperature sensing unit such that the voltage output changes based on changes in the sensed temperature; and
a PMOS back bias voltage outputting unit configured to receive the voltage output by the second voltage adjusting unit and configured to output the PMOS back bias voltage based on the voltage output by the second voltage adjusting unit; and wherein
the MOS back bias voltage generator is a NMOS back bias voltage generator,
the MOS back bias voltage is a NMOS back bias voltage, and
the MOS back bias voltage outputting unit is a NMOS back bias voltage outputting unit.

26. The memory integrated circuit device of claim 25, wherein
the second voltage adjusting unit is configured to adjust the voltage output such that the PMOS back bias voltage outputting unit increases the PMOS back bias voltage if the sensed temperature increases, and decreases the PMOS back bias voltage if the sensed temperature decreases, and the first voltage adjusting unit is configured to adjust the voltage output such that the NMOS back bias voltage outputting unit decreases the NMOS back bias voltage if the sensed temperature increases, and increases the NMOS back bias voltage if the sensed temperature decreases.

27. The memory integrated circuit device of claim 26, further comprising:

a differential amplifier including a plurality of PMOS transistors and a plurality of NMOS transistors, wherein the PMOS back bias voltage is used as back bias voltage for the plurality of PMOS transistors, and the NMOS back bias voltage is used as back bias voltage for the plurality of NMOS transistors.

28. The memory integrated circuit device of claim 26, further comprising:

an input/output sense amplifier including a plurality of PMOS transistors and a plurality of NMOS transistors, wherein the PMOS back bias voltage is used as back bias voltage for the plurality of PMOS transistors, and the NMOS back bias voltage is used as back bias voltage for the plurality of NMOS transistors.

29. A memory integrated circuit device comprising:

a MOS back bias voltage generator configured to generate a MOS back bias voltage, the MOS back bias voltage generator including, a first temperature sensing unit configured to sense a temperature of the memory integrated circuit device;

a first voltage adjusting unit configured to receive an output signal of the first temperature sensing unit and configured to output a voltage based on the output signal of the first temperature sensing unit such that the voltage output changes based on changes in the sensed temperature; and a MOS back bias voltage outputting unit configured to receive the voltage output by the first voltage adjusting unit and configured to output the MOS back bias voltage based on the voltage output by the first voltage adjusting unit, wherein the MOS back bias voltage outputting unit includes a differential amplifier configured to receive a first external reference voltage and the output voltage of the first voltage adjusting unit, and an NMOS back bias voltage oscillation and pumping unit configured to receive a voltage output by the differential amplifier, configured to output an NMOS back bias voltage, configured to decrease the NMOS back bias voltage if the output voltage of the differential amplifier is active, and configured to increase the NMOS back bias voltage if the output voltage of the differential amplifier is inactive.

30. A memory integrated circuit device comprising:

a MOS back bias voltage generator configured to generate a MOS back bias voltage, the MOS back bias voltage generator including, a first temperature sensing unit configured to sense a temperature of the memory integrated circuit device;

a first voltage adjusting unit configured to receive an output signal of the first temperature sensing unit and configured to output a voltage based on the output signal of the first temperature sensing unit such that the voltage output changes based on changes in the sensed temperature; and a MOS back bias voltage outputting unit configured to receive the voltage output by the first voltage adjusting unit and configured to output the MOS back bias voltage based on the voltage output by the first voltage adjusting unit, wherein the first temperature sensing unit is configured to receive a refresh signal for refreshing a plurality of memory cells included in the memory integrated circuit device, and is configured to be activated to sense the temperature of the memory integrated circuit device if the refresh signal is active.

31. A memory integrated circuit device comprising:

a MOS back bias voltage generator configured to generate a MOS back bias voltage, the MOS back bias voltage generator including, a first temperature sensing unit configured to sense a temperature of the memory integrated circuit device;

a first voltage adjusting unit configured to receive an output signal of the first temperature sensing unit and configured to output a voltage based on the output signal of the first temperature sensing unit such that the voltage output changes based on changes in the sensed temperature; and a MOS back bias voltage outputting unit configured to receive the voltage output by the first voltage adjusting unit and configured to output the MOS back bias voltage based on the voltage output by the first voltage adjusting unit, wherein the back bias voltage is at least one of higher than a power supply voltage and a negative voltage lower than a ground voltage of the memory integrated circuit device.

* * * * *